US010311964B2

(12) United States Patent
Wu et al.

(10) Patent No.: US 10,311,964 B2
(45) Date of Patent: Jun. 4, 2019

(54) MEMORY CONTROL CIRCUIT AND MEMORY TEST METHOD

(71) Applicant: INDUSTRIAL TECHNOLOGY RESEARCH INSTITUTE, Hsinchu (TW)

(72) Inventors: Kuan-Te Wu, New Taipei (TW); Jenn-Shiang Lai, Hsinchu (TW); Chih-Yen Lo, Hsinchu (TW); Jin-Fu Li, Taoyuan (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 119 days.

(21) Appl. No.: 15/598,077

(22) Filed: May 17, 2017

(65) Prior Publication Data

US 2018/0182466 A1  Jun. 28, 2018

(30) Foreign Application Priority Data

Dec. 27, 2016  (TW) .............................. 105143402 A

(51) Int. Cl.
*G11C 29/24* (2006.01)
*G11C 29/36* (2006.01)
(Continued)

(52) U.S. Cl.
CPC .............. *G11C 29/14* (2013.01); *G11C 29/16* (2013.01); *G11C 29/36* (2013.01)

(58) Field of Classification Search
CPC ......... G11C 29/14; G11C 29/36; G11C 29/16; H04L 9/3215; H04L 9/3271
See application file for complete search history.

(56) References Cited

U.S. PATENT DOCUMENTS 5,173,906 A * 12/1992 Dreibelbis .............. G06F 11/27
714/733
5,535,164 A * 7/1996 Adams ........... G01R 31/318527
365/201

(Continued)

FOREIGN PATENT DOCUMENTS

CN         1979690 A    6/2007
CN       102467974 A    5/2012
(Continued)

OTHER PUBLICATIONS

Baosheng Wang, et al., "Test/Repair Area Overhead Reduction for Small Embedded SRAMs", 15th Asian Test Symposium (ATS'06), IEEE Computer Society, 2006, 6 pages.

(Continued)

*Primary Examiner* — Phung M Chung
(74) *Attorney, Agent, or Firm* — Muncy, Geissler, Olds & Lowe, P.C.

(57) ABSTRACT

A memory control circuit, coupled to a multi-channel memory, includes a plurality of channel controllers coupled to respective channel memories of the multi-channel memory, and a built-in self-test (BIST) circuit. The BIST circuit includes a BIST controller and a plurality of command index registers which store respective command indexes related to the channel controllers. The BIST controller receives notification from at least two channel controllers of the channel controllers, which indicates that the at least two channel controllers complete respective current test commands. When the BIST controller arbitrates, the BIST controller selects at least a channel controller from the at least two channel controllers which send the notification, and sends respective next test command(s) to the selected at least one channel controller based on the respective com- (Continued)

mand index(es) of the selected at least one channel controller.

16 Claims, 4 Drawing Sheets

(51) Int. Cl.
    *G06F 13/00*     (2006.01)
    *G11C 29/14*     (2006.01)
    *G11C 29/16*     (2006.01)

(56) References Cited

U.S. PATENT DOCUMENTS

| | | | |
|---|---|---|---|
| 5,553,082 A * | 9/1996 | Connor | G11C 29/38 |
| | | | 714/726 |
| 5,689,466 A | 11/1997 | Qureshi | |
| 5,982,684 A | 11/1999 | Schwartzlow et al. | |
| 5,995,731 A | 11/1999 | Crouch et al. | |
| 6,360,342 B1 | 3/2002 | Lee et al. | |
| 6,658,610 B1 | 12/2003 | Chai et al. | |
| 7,208,969 B2 | 4/2007 | Golan | |
| 7,360,134 B1 * | 4/2008 | Jacobson | G01R 31/3187 |
| | | | 714/30 |
| 9,361,973 B2 | 6/2016 | Maheshwari | |
| 2007/0007981 A1 | 1/2007 | Golan | |
| 2008/0059850 A1 | 3/2008 | Bahl | |
| 2015/0106673 A1 | 4/2015 | Huang et al. | |

FOREIGN PATENT DOCUMENTS

| | | |
|---|---|---|
| KR | 1020070069350 A | 7/2007 |
| TW | 411463 B | 11/2000 |
| TW | I407124 B | 9/2013 |
| TW | I413987 B | 11/2013 |

OTHER PUBLICATIONS

B. Nadeau-Dostie, et al., "A serial interfacing technique for built-in and external testing of embedded memories", 1989 Proceedings of the IEEE Custom Integrated Circuits Conference, 5 pages.

W. B. Jone, et al., "An efficient BIST method for small buffers", Proceedings 17th IEEE VLSI Test Symposium (Cat. No. PR00146), 1999, pp. 246-251.

V. Arora, et al., "A Parallel Built-In Self-Diagnostic Method for Nontraditional Faults of Embedded Memory Arrays", IEEE Transactions on Instrumentation and Measurement, vol. 53, No. 4, Aug. 2004, pp. 915-932.

Kuo-Liang Cheng, et al., "Automatic generation of memory built-in self-test cores for system-on-chip", Proceedings 10th Asian Test Symposium, Kyoto, 2001, pp. 91-96.

L. M. Denq et al., "A Hybrid BIST Scheme for Multiple Heterogeneous Embedded Memories", 16th Asian Test Symposium (ATS 2007), Beijing, 2007, pp. 349-354.

Y. J. Huang et al., "A Low-Cost Pipelined BIST Scheme for Homogeneous RAMs in Multicore Chips", 2008 17th Asian Test Symposium, Sapporo, 2008, pp. 357-362.

M. Miyazaki, et al., "A memory grouping method for sharing memory BIST logic", Asia and South Pacific Conference on Design Automation, 2006, Yokohama, 2006, pp. 671-676.

L. Martirosyan, et al., "A power based memory BIST grouping methodology", 2015 IEEE East-West Design & Test Symposium (EWDTS), Batumi, 2015, 4 pages.

* cited by examiner

MEMORY CONTROL CIRCUIT AND MEMORY TEST METHOD

This application claims the benefit of Taiwan application Serial No. 105143402, filed Dec. 27, 2016, the disclosure of which is incorporated by reference herein in its entirety.

TECHNICAL FIELD

The disclosure relates in general to a memory control circuit and a memory test method.

BACKGROUND

In personal computers or common hand-held smart mobile devices, the memory is an essential element. As the semiconductor technology is improved on manufacturing process and product yield rate, the memory efficiency is also advanced.

In the hand-held smart mobile device and the computer, multi-channel memory technology is used to improve the memory efficiency. In the multi-channel memory technology, a plurality of parallel memory channels are between the dynamic random access memory (DRAM) and the memory control circuit to improve data throughput.

Each channel of the multi-channel memory is independent. However, the access latency between the channels may be different due to manufacture process variations. Or, even for the same channel, the access latency may be varied because of the usage time, the temperature or the interface between the memory and the memory control circuit.

Built-in self-test (BIST) circuit is widely used in many memory products for memory test. BIST circuit can improve test quality with low test cost.

How to test the multi-channel memory in a low-cost, fast and accurate way is an important issue.

SUMMARY

According to one embodiment, a memory control circuit coupled to a multi-channel memory is provided. The memory control circuit includes: a plurality of channel controllers, coupled to a respective one of a plurality of channel memories of the multi-channel memory; and a built-in self-test (BIST) circuit, coupled to the channel controllers, the BIST circuit including a BIST controller and a plurality of command index registers, the BIST controller being coupled to the channel controllers, the command index registers being coupled to the BIST controller, the command index registers storing respective command indexes of the channel controllers. The BIST controller receives inform from at least two of the channel controllers which indicates that the informing at least two channel controllers already complete respective current test commands. When the BIST controller arbitrates, the BIST controller selects at least one channel controller from the informing at least two channel controllers, and based on the respective command index(es) of the selected at least one channel controller, the BIST controller sends respective next test command(s) to the selected at least one channel controller.

According to another embodiment, a multi-channel test method applied to a multi-channel memory is provided. The multi-channel memory is coupled to a plurality of channel controllers. The multi-channel test method includes: receiving inform from at least two of the channel controllers which indicates that the informing at least two channel controllers already complete respective current test commands; and arbitrating and selecting at least one channel controller from the informing at least two channel controllers, and based on respective command index(es) of the selected at least one channel controller, sending respective next test command(s) to the selected at least one channel controller.

Figure 1:
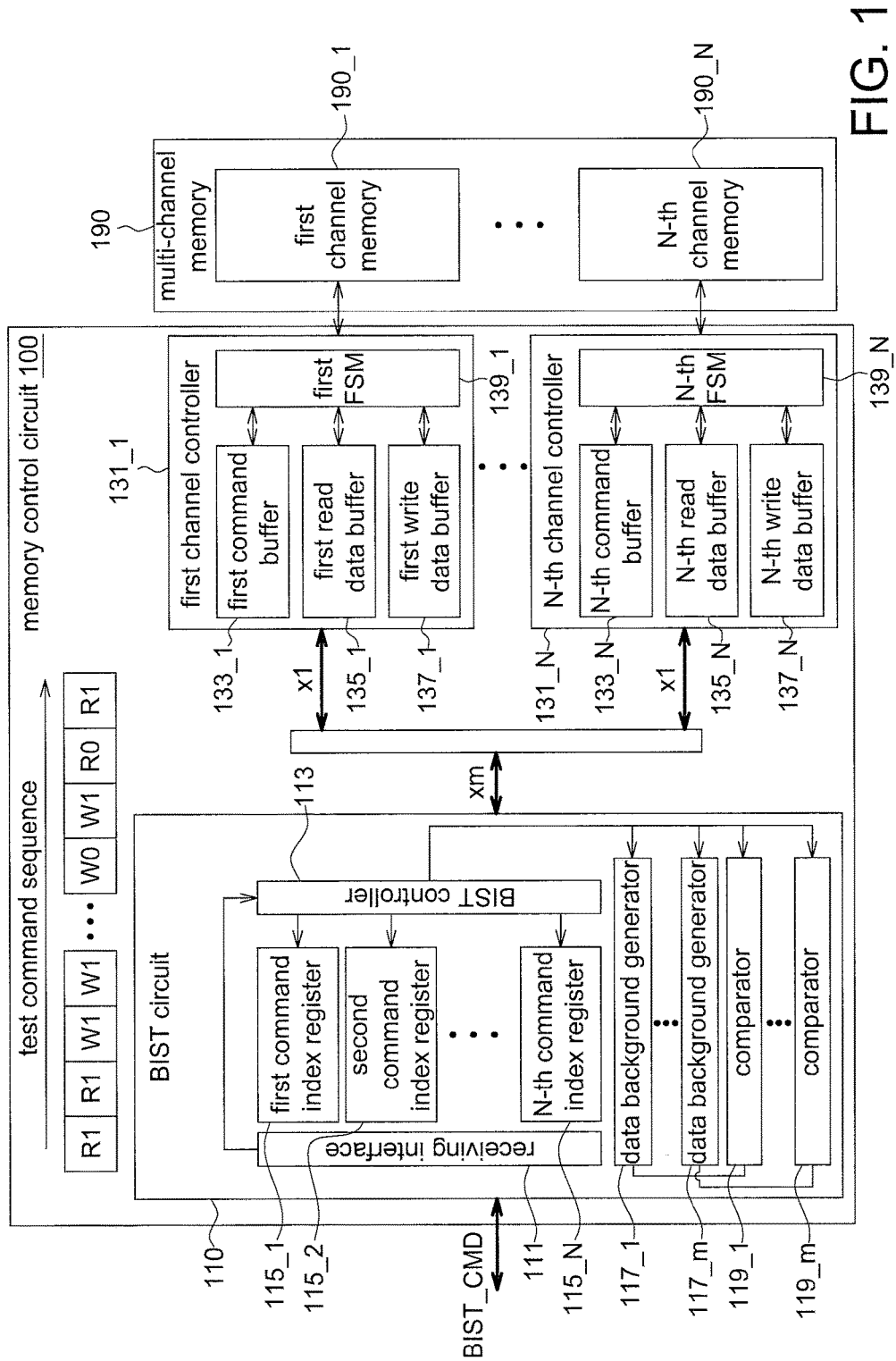
FIG. 1 shows a functional block diagram of a memory control circuit according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a memory control circuit according to an embodiment of the disclosure. The memory control circuit 100 is coupled to and control a multi-channel memory 190. The multi-channel memory 190 includes N channel memories 190_1-190_N (N being a natural number).

The memory control circuit 100 includes a built-in self-test (BIST) circuit 110 and N channel controllers 131_1-131_N. The BIST circuit 110 includes a receiving interface 111, a BIST controller 113, N command index registers 115_1-115_N, m data background generators 117_1-117_m and m comparators 119_1-119_m (m being a natural number and m being smaller or equal to N).

The first channel controller 131_1 includes a first command buffer 133_1, a first read data buffer 135_1, a first write data buffer 137_1 and a first finite state machine (FSM) 139_1. Similarly, the N-th channel controller 131_N includes a N-th command buffer 133_N, a N-th read data buffer 135_N, a N-th write data buffer 137_N and a N-th FSM 139_N. Other channel controllers have the same or similar circuit configuration.

The receiving interface 111 is coupled to the BIST controller 113. The receiving interface 111 receives a BIST command BIST_CMD. For example but not limited by, the receiving interface 111 serially receives the BIST command BIST_CMD. The BIST command BIST_CMD includes, for example, a test algorithm indication parameter. In an embodiment of the disclosure, there are many default test algorithms in the BIST controller 113. Each test algorithm may include different number of test commands and different test command sequence from each other. For example but not limited by, in three default test algorithms of the BIST controller 113, a first test algorithm includes R0R0R1R1W1W1W0W0 . . . , wherein "R0" refers to read 0 from the channel memory while "W1" refer to write 1 into the channel memory, and so on. A second test algorithm includes R1R1R0R0W1W1W0W0 . . . and a third test algorithm includes W1W1W0W0R1R1R0R0. The above description is for example and the disclosure is not limited. After the receiving interface 111 receives the BIST command BIST_CMD which includes a complete test algorithm indication parameter, the receiving interface 111 sends the BIST command BIST_CMD to the BIST controller 113. Thus, the BIST controller 113 will determine which one of the default test algorithm is to be used in this test (for example, the second test algorithm is used), and the BIST controller 113 generates corresponding test commands to the channel controllers 131_1-131_N. In an embodiment of the disclosure, based on the BIST command BIST_CMD, the BIST controller 113 selects a default test algorithm and generates a plurality of sequential test commands until the test is complete.

The BIST controller 113 decodes based on the BIST command BIST_CMD which for example includes the test algorithm indication parameter, and the BIST controller 113 generates corresponding test commands to the channel controllers 131_1-131_N. When the BIST controller 113 sends the corresponding test commands to the channel controllers 131_1-131_N, the BIST controller 113 updates the command index registers 115_1-115_N. When the channel controllers 131_1-131_N complete the respective current test command, the channel controller informs the BIST controller 113. If there is conflict between the channel controllers 131_1-131_N, the BIST controller 113 arbitrates.

The N command index registers 115_1-115_N are coupled to the BIST controller 113. The N command index registers 115_1-115_N store the respective next test command indexes of the channel controllers 131_1-131_N. In an embodiment of the disclosure, because the access latency of each channel memory may be different from each other, the respective current test command perform by the channel memories may be different and thus the timing at which the channel memory completes the respective current test command may be different.

In the following, the second test algorithm is used as an example. In initialization of the test, the BIST controller 113 sets the respective current test command index of the N command index registers 115_1-115_N as "1", which refers that the channel controllers 131_1-131_N will perform the first test command. For example but not limited by, the BIST controller 113 sends the first test command to the channel controllers 131_1-131_N and then the BIST controller 113 updates the respective current test command index of the N command index registers 115_1-115_N as "2". Then, for example but not limited by, the first channel controller 131_1 completes the first test command earliest among the channel controllers 131_1-131_N. The first channel controller 131_1 returns and informs the BIST controller 113 (the channel controller which informs the BIST controller 113 may also be referred as "the informing channel controller"). The BIST controller 113 sends the second test command to the first channel controller 131_1 and updates the current test command index of the command index register 115_1 as "3" (while at this moment, the respective current test command indexes of the command index register 115_2-115_N are still "2"). When the third channel controller 131_3 completes the first test command, the third channel controller 131_3 returns and informs the BIST controller 113. The BIST controller 113 sends the second test command to the third channel controller 131_3 and updates the current test command index of the command index register 115_3 as "3" (while at this moment, the respective current test command indexes of the command index register 115_2, 115_4-115_N are still "2"), and so on.

In other words, in an embodiment of the disclosure, when the channel controller completes the current test command and informs the BIST controller 113, the BIST controller 113 sends the respective next test command to the (informing) channel controller and updates the test command index of the corresponding command index register.

The m data background generators 117_1-117_m are coupled to the BIST controller 113, and are for generating the write data or the expectation data. In an embodiment of the disclosure, them data background generators 117_1-117_m generate m different write data or m different expectation data. The m comparators 119_1-119_m are coupled to the BIST controller 113 and the m data background generators 117_1-117_m. In executing the write test command, one or more or all of the m data background generators 117_1-117_m generate the write data (e.g. at most m different write data) and send the write data to one or more of the N channel controllers 131_1-131_N under control of the BIST controller 113. In executing the read test command, one or more or all of the m data background generators 117_1-117_m generate the expectation data (e.g. at most m different expectation data) and the comparators 119_1-119_m compare the read data returned from one or more of the channel controllers 131_1-131_N with the expectation data to decide whether the read test is passed or failed. In an embodiment of the disclosure, the channel controllers 131_1-131_N may compare m different expectation data.

The command buffers 133_1-133_N are coupled to the BIST controller 113. The command buffers 133_1-133_N are for buffering the test commands received from the channel controllers 131_1-131_N and for sending the test commands to the FSM 139_1-139_N. The read data buffers 135_1-135_N are coupled to the BIST controller 113 and are configured to buffer the data read from the channel memories 190_1-190_N. In executing the write test command, the write data is buffered in the write data buffers 137_1-137_N (which are coupled to the BIST controller 113) and written into the channel memories 190_1-190_N by the FSMs 139_1-139_N.

The FSMs 139_1-139_N are coupled to the command buffers 133_1-133_N, the read data buffers 135_1-135_N, the write data buffers 137_1-137_N and the channel memories 190_1-190_N. The FSMs 139_1-139_N perform read and/or write operations on the channel memories 190_1-190_N based on the test commands buffered in the command buffers 133_1-133_N.

In read test, based on the read test command, the FSMs 139_1-139_N buffer data read from the channel memories 190_1-190_N into the read data buffers 135_1-135_N. The FSMs 139_1-139_N inform the BIST controller 113 and return the read data back to the BIST controller 113.

In write test, based on the write test command, the FSMs 139_1-139_N inform the BIST controller 113 and the BIST controller 113 sends the write data to the write data buffers 137_1-137_N. The FSMs 139_1-139_N further write the data buffered in the write data buffers 137_1-137_N to the channel memories 190_1-190_N.

Figure 2:
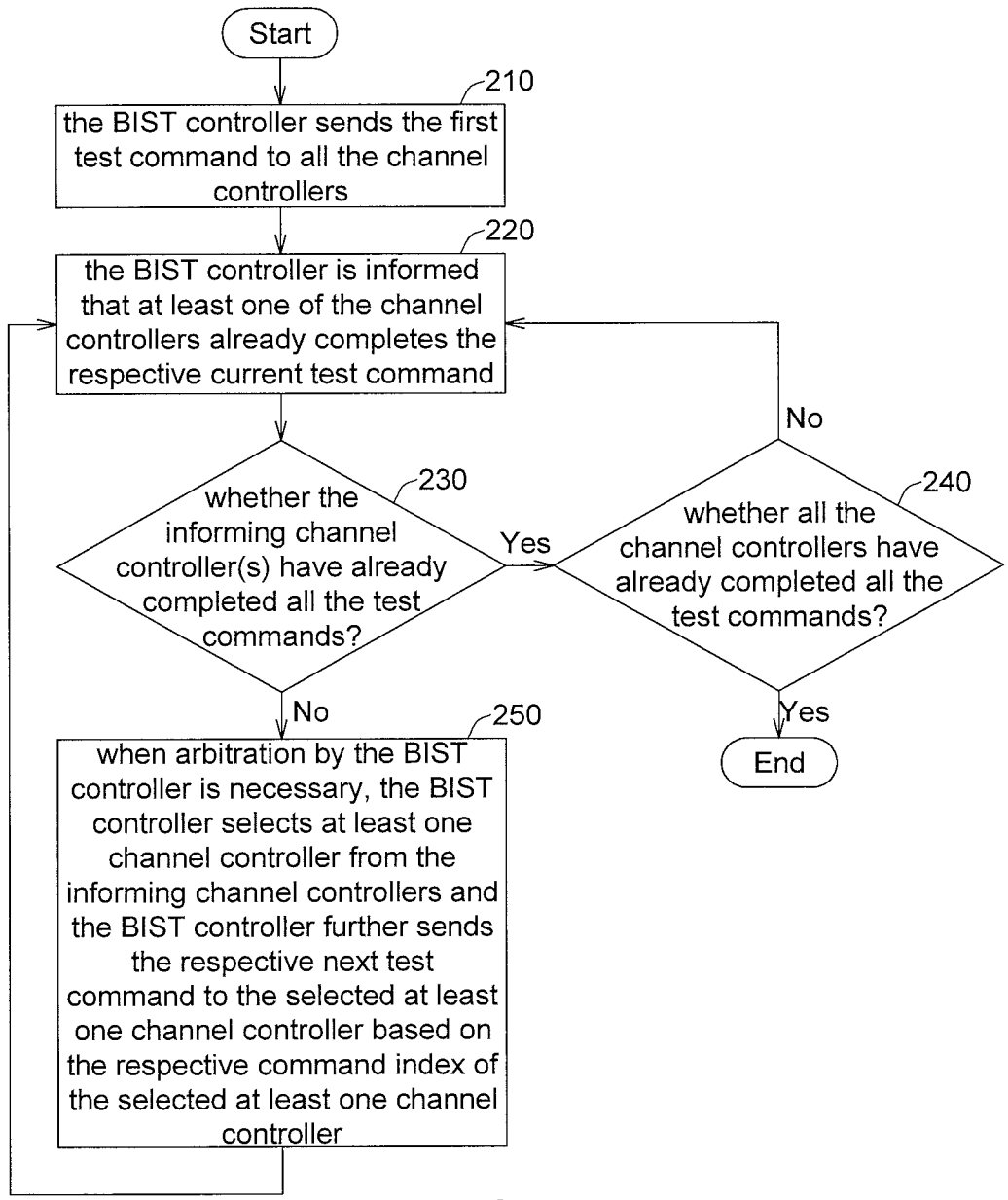
FIG. 2 shows a flow chart of a multi-channel memory test method according to an embodiment of the disclosure.

Now refer to FIG. 2. FIG. 2 shows a flow chart of a multi-channel memory test method according to an embodiment of the disclosure. In step 210, the BIST controller 113 sends the first test command to all the channel controllers 131_1-131_N.

In step 220, the BIST controller 113 is informed that at least one (or at least two) of the channel controllers 131_1-131_N already complete(s) the respective current test command.

In step 230, the BIST controller 113 determines that whether the channel controller(s) which inform the BIST controller 113 have already completed all the test commands.

If yes in the step 230, then the flow proceeds to the step 240. If no in the step 230, then the flow proceeds to the step 250.

In step 240, the BIST controller 113 determines that whether all the channel controllers 131_1-131_N have already completed all the test commands. If yes in step 240, then the test flow ends. If no in step 240, then the flow returns to the step 220.

In step 250, when arbitration by the BIST controller 113 is necessary (which means that there are more than one channel controllers concurrently inform the BIST controller 113), the BIST controller 113 selects at least one channel controller from the informing channel controller(s) (which inform the BIST controller 113). The BIST controller 113 further sends the respective next test command to the selected at least one channel controller based on the respective command index of the selected at least one channel controller.

In details, in step 250, the BIST controller 113 determines whether conflict occurs. In other words, the BIST controller 113 determines that whether there are more than one channel controllers inform the BIST controller 113 about the complete of the respective current test command. If conflict between the channel controllers occurs, the BIST controller 113 arbitrates. In an embodiment of the disclosure, the arbitration mechanism of the BIST controller 113 is not specially defined. After the BIST controller 113 arbitrates, the BIST controller 113 sends the respective next test command to the selected channel controller(s).

For example, but not limited by, the BIST controller 113 is informed by the three channel controllers 131_1, 131_3 and 131_5. After arbitration, the BIST controller 113 selects the channel controller 131_1. Based on the command index of the command index register 115_1, the BIST controller 113 sends the next test command to the channel controller 131_1.

Figure 3:
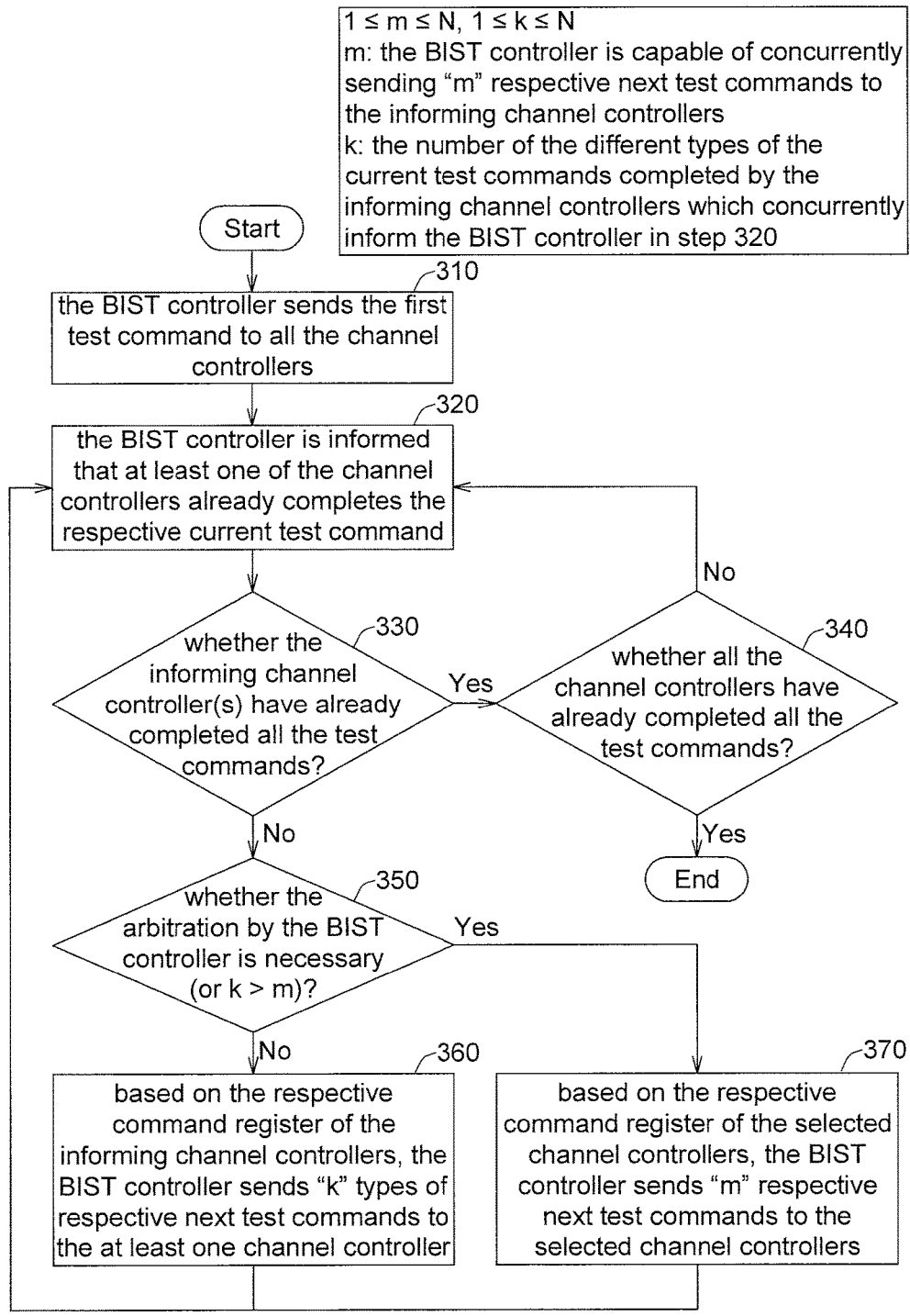
FIG. 3 shows a flow chart of a multi-channel memory test method according to another embodiment of the disclosure.

Now refer to FIG. 3. FIG. 3 shows a flow chart of a multi-channel memory test method according to another embodiment of the disclosure. In step 310, the BIST controller 113 sends the first test command to all the channel controllers 131_1-131_N.

In step 320, the BIST controller 113 is informed that at least one (or at least two) of the channel controllers 131_1-131_N already complete(s) the respective current test command. In different cycles, the number of the informing channel controllers which concurrently complete the respective current test command may be different. For example, but not limited by, in a cycle, there are two channel controllers which concurrently complete the respective current test command and inform the BIST controller 113. But in another cycle, there may be four channel controllers which concurrently complete the respective current test command and inform the BIST controller 113.

In step 330, the BIST controller 113 determines that whether the at least one (or the at least two) channel controller(s) which inform the BIST controller 113 have already completed all the test commands.

If yes in the step 330, then the flow proceeds to the step 340. If no in the step 330, then the flow proceeds to the step 350.

In step 340, the BIST controller 113 determines that whether all the channel controller(s) 131_1-131_N have already completed all the test commands. If yes in step 340, then the test flow ends. If no in step 340, then the flow returns to the step 320.

In step 350, the BIST controller 113 determines whether the arbitration is necessary. In other words, the BIST controller 113 determines whether a parameter "k" is larger than a parameter "m". The parameter "k" is a natural number which is smaller than or equal to N. The parameter "k" refers to the number of the different types of the current test commands completed by the informing channel controllers which concurrently inform the BIST controller 113 during the same cycle. The parameter "k" is variable. That is, the parameter "k" is the type number of the test commands completed by the channel controllers. The parameter "m" refers to that the BIST controller 113 is capable of concurrently sending "m" respective next test commands to the informing channel controllers. That is, the parameter "m" is a maximum type number of the test commands that the BIST controller may concurrently send (also referred as a maximum support command type number). In principle, the parameter "m" is fixed and is related to the hardware design of the memory control circuit. If the parameter "nn" is larger, the test efficiency of the memory control circuit 100 is better but the cost is also higher, and vice versa. Besides, in the step 310, the BIST controller 113 sends the first test command to all the channel controllers, which means that all the channel controllers receive the same first test command. Thus, the step 310 meets the requirement of the parameter "m".

If no in the step 350 (which means the BIST controller 113 determines that the number of the types of the completed test commands is not larger than the maximum type number of the test commands that the BIST controller 113 may concurrently send, or means the arbitration is not necessary), the flow proceeds to the step 360. If yes in the step 350 (which means the BIST controller 113 determines that the number of the types of the completed test commands is larger than the maximum type number of the test commands that the BIST controller may concurrently send, or means the arbitration is necessary), the flow proceeds to the step 370.

In step 360, based on the respective command register of the at least one or at least two informing channel controllers, the BIST controller 113 sends "k" types of respective next test commands to the at least one or at least two informing channel controller(s). That is, in the step 360, the BIST controller 113 determines that the BIST controller 113 is capable of sending the respective next test commands to all the at least one or at least two informing channel controller(s) of step 320. In other words, the type number of the respective next test commands sent from the BIST controller 113 to the informing channel controller(s) is equal to the type number of the test commands completed by the informing channel controller(s). In one embodiment, there may be two or more channel controllers which concurrently complete the same test command. Thus, the channel controllers which concurrently complete the same test command may receive the same type of the respective next test command and accordingly, the number of the channel controllers which concurrently complete the test commands may be larger or equal to the number of the test command types which are concurrently completed by the channel controllers.

In step 370, based on the respective command register of the selected channel controllers, the BIST controller 113 sends "m" respective next test commands to the selected channel controllers. In other words, in step 370, the BIST controller 113 determines that the BIST controller 113 is not capable of concurrently sending "k" types of the respective next test commands (for example, due to the hardware limitation) to the informing channel controllers (because "k" is larger than "m"). Thus, the BIST controller 113 arbitrates, and based on the respective command register of the selected channel controllers, the BIST controller 113 sends "m" respective next test commands to the selected channel controllers. In other words, the BIST controller 113 sends to the selected channel controllers the respective next test commands whose type number matches the maximum support command type number. In one embodiment, there may be two or more channel controllers which concurrently complete the same test command. Thus, the selected channel controllers may receive the same type of the respective test commands. The number of the selected channel controllers may be larger than or equal to the maximum support command type number.

In another possible embodiment, in step 350, it is determined that whether the BIST controller 113 is capable of concurrently sending the respective next test commands to the informing channel controller(s). If it is determined that the BIST controller 113 is capable of concurrently sending the respective next test commands to the informing channel controller(s), then based on the respective command indexes of the informing channel controllers, the BIST controller 113 sends the respective test commands to the informing channel controllers and updates the respective command indexes of the informing channel controllers. On the contrary, if it is determined that the BIST controller 113 is not capable of concurrently sending the respective next test commands to the informing channel controller(s), then the BIST controller 113 selects among the informing channel controllers, sends the respective test commands to the selected channel controllers based on the respective command indexes of the selected channel controllers, and updates the respective command indexes of the selected channel controllers.

Several examples are described in the following description for explanation. Example One: m=3, k=2.

In the step 320, the BIST controller 113 is informed that the three channel controllers 131_1, 131_3 and 131_5 concurrently complete their respective current test commands. For example, but not limited by, the respective current command indexes of the three channel controllers 131_1, 131_3 and 131_5 are 5, 5 and 8. Based on this, the BIST controller 113 determines that the channel controllers 131_1 and 131_3 complete the fourth test command and the channel controller 131_5 completes the seventh test command. The test commands (the fourth test command) completed by the channel controllers 131_1 and 131_3 are the same, which are different from the test command (the seventh test command) completed by the channel controller 131_5. Thus, the BIST controller 113 determines that the three channel controllers 131_1, 131_3 and 131_5 which concurrently inform the BIST controller 113 have already completed two types of the test commands (i.e. the fourth test command and the seventh test command), i.e. k=2. If the three channel controllers 131_1, 131_3 and 131_5 have not completed all the test commands yet, in the step 350, the BIST controller determines that the arbitration is unnecessary because the parameter "k" (k=2) is smaller than the parameter "m" (m=3).

In the step 360, based on the respective command indexes of the informing channel controllers 131_1, 131_3 and 131_5, the BIST controller 113 sends the respective next test commands to the channel controllers 131_1, 131_3 and 131_5. For example, the respective current command indexes of the three channel controllers 131_1, 131_3 and 131_5 are 5, 5 and 8. Then, the BIST controller 113 sends the fifth test command to the channel controllers 131_1 and 131_3, and sends the eighth test command to the channel controller 131_5. The BIST controller 113 further updates the respective command indexes of the informing channel controllers 131_1, 131_3 and 131_5 as 6, 6 and 9.

Example Two: m=3, k=4.

In the step 320, the BIST controller 113 is informed that the four channel controllers 131_2, 131_4, 131_6 and 131_8 concurrently complete their respective current test commands. The BIST controller 113 determines that the test commands completed by the four channel controllers 131_2, 131_4, 131_6 and 131_8 are different from each other (i.e. k=4). For example but not limited by, the respective current command indexes of the channel controllers 131_2, 131_4, 131_6 and 131_8 are 3, 5, 7 and 9. Based on this, the BIST controller 113 determines that the channel controllers 131_2, 131_4, 131_6 and 131_8 complete the second, the fourth, the sixth and the eight test commands, respectively. If the channel controllers 131_2, 131_4, 131_6 and 131_8 have not completed all the test commands yet, in the step 350, the BIST controller 113 determines that the arbitration is necessary (because the parameter "k" (k=4) is larger than the parameter "m" (m=3)). That is, the BIST controller 113 is not capable of concurrently sending four different types of the next test commands to the channel controllers 131_2, 131_4, 131_6 and 131_8 (for example, this is beyond the hardware limitation). In the step 370, the BIST controller 113 arbitrates that, for example but not limited by, the BIST controller 113 selects the channel controllers 131_2, 131_4 and 131_6 from the channel controllers 131_2, 131_4, 131_6 and 131_8. Based on the respective command indexes of the selected channel controllers 131_2, 131_4 and 131_6, the BIST controller 113 sends the respective next test commands to the channel controllers 131_2, 131_4 and 131_6. For example, the respective current command indexes of the selected channel controllers 131_2, 131_4 and 131_6 are 3, 5 and 7. Then, the BIST controller 113 sends the third test command to the channel controller 131_2, and sends the fifth test command to the channel controller 131_4, and sends the seventh test command to the channel controller 131_6. The BIST controller 113 further updates the respective command indexes of the selected channel controllers 131_2, 131_4 and 131_6 as 4, 6 and 8. The command index of the unselected channel controller 131_8 is still "9" because the BIST controller 113 does not send the next test command to the unselected channel controller 131_8.

From the above description, in an embodiment of the disclosure, the BIST controller 113 may dynamically send the respective next test commands to the informing channel controllers in response to the inform from the one or more channel controllers.

Figure 4:
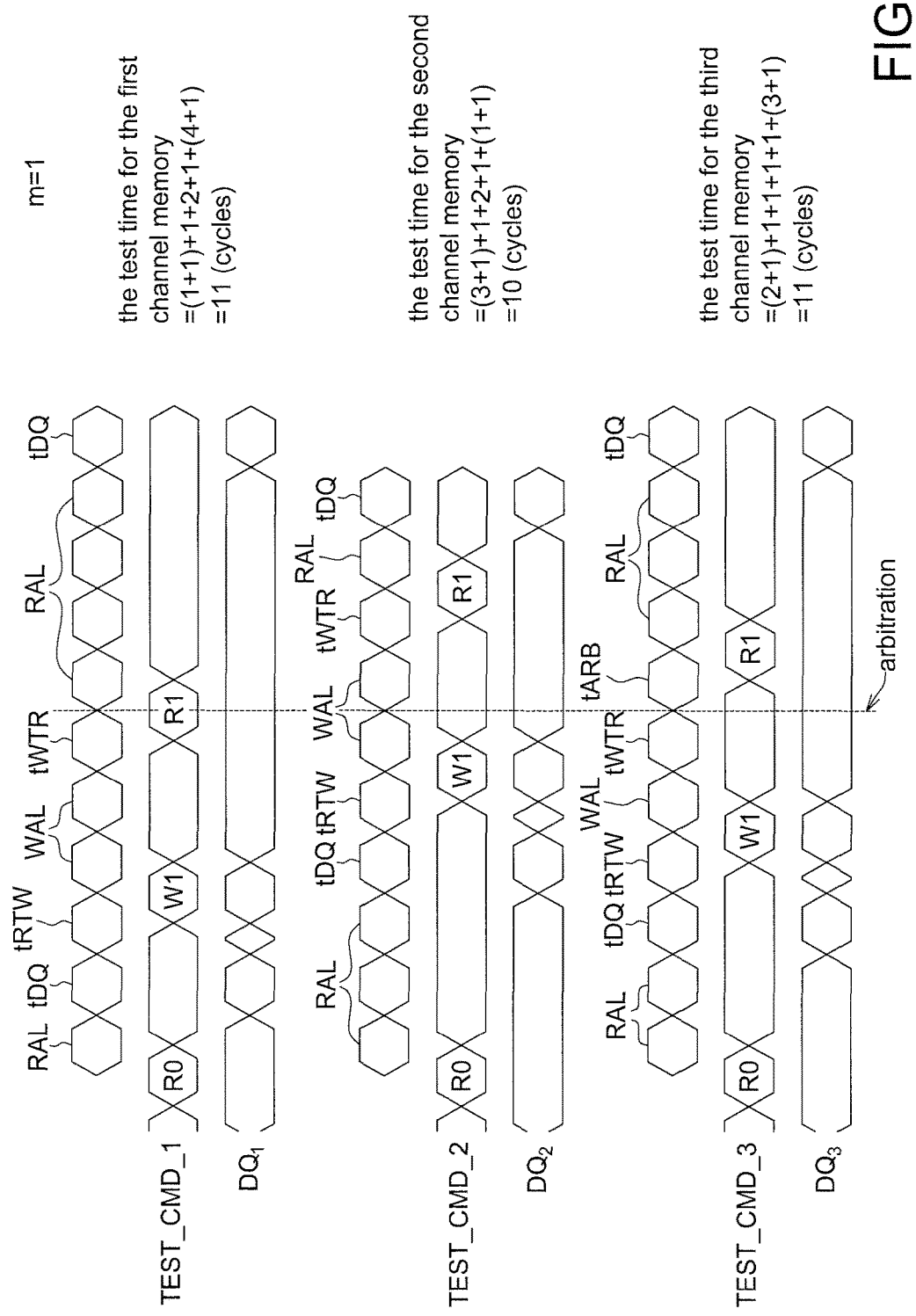
FIG. 4 shows a test efficiency diagram for the multi-channel memory test method according to an embodiment of the disclosure.

Now, the test efficiency of the multi-channel memory test method according to an embodiment of the disclosure is described. FIG. 4 shows a test efficiency diagram for the multi-channel memory test method according to an embodiment of the disclosure.

In here, taken as an example, "read 0 (R0)", "write 1 (W1)" and "read 1 (R1)" test operations are performed on the first to the third channel memories and m=1. The latency tRTW of the read-to-write operation is one cycle. The latency tWTR of the write-to-read operation is one cycle. The latency tDQ of the data output is one cycle. Thus, the read/write latency of the first to the third channel memories are as table 1:

TABLE 1

|  | R0 RAL | W1 WAL | R1 RAL |
|---|---|---|---|
| The first channel memory | 1 | 2 | 4 |
| The second channel memory | 3 | 2 | 1 |
| The third channel memory | 2 | 1 | 3 |

In table 1, "RAL" refers to the read access latency and "WAL" refers to the write access latency.

In FIG. 4, TEST_CMD_1-TEST_CMD_3 is the test commands for the first to the third channel memories, respectively. $DQ_1$ refers to the signal on the data transmission line of the first channel controller 131_1 and so are $DQ_2$ and $DQ_3$.

The test time for the first channel memory is expressed as: (RAL+tDQ)+tRTW+WAL+tWTR+(RAL+tDQ)=(1+1)+1+2+1+(4+1)=11 (cycles). Similarly, the test time for the second channel memory is expressed as: (RAL+tDQ)+tRTW+WAL+tWTR+(RAL+tDQ)=(3+1)+1+2+1+(1+1)=10 (cycles). The test time for the third channel memory is expressed as: (RAL+tDQ)+tRTW+WAL+tWTR+tARB+(RAL+tDQ)=(2+1)+1+1+1+1+(3+1)=11 (cycles).

In the test time for the third channel memory, "tARB" refers to the arbitration latency time. In here, it is assumed that the first channel is given the high priority in the arbitration by the BIST controller and thus the third channel memory has to wait for one cycle for receiving the next test command (R1).

Table 2 shows the test efficiency between an embodiment of the disclosure and the test methods without applying the disclosure:

TABLE 2

|  | Dedicated BIST (without applying embodiment of the disclosure) | Shared BIST-serial (without applying embodiment of the disclosure) | Shared BIST-parallel (without applying embodiment of the disclosure) | an embodiment of the disclosure |
|---|---|---|---|---|
| Test time | 11 cycles | 31 cycles | 13 cycles | 11 cycles |
| The number of the BIST circuit | 3 | 1 | 1 | 1 |
| The number of the total pins | 3 times | 1 time | 1 time | 1 time |
| The test cost | 3 | 2.8 | 1.2 | 1 |

In table 2, in the "dedicated BIST" test method, each channel memory is allocated with a dedicated BIST circuit. In the "shared BIST-serial" test method, all the channel memories share the same BIST circuit and the test is performed in serial. The serial test refers to that, after all test commands on the current channel memory are completed, then the next channel memory is tested. In the "shared BIST-parallel" test method, all the channel memories share the same BIST circuit and the test is performed in parallel. The parallel test refers to that, after the current test command on all the channel memories is completed, then the next test command on all the channel memories is tested.

In general, the test cost is expressed as: (the number of the pins)*(the test time)*(the cost of the test machine per second). Thus, if the test cost of an embodiment of the disclosure is taken as a base, then the test cost for the other three test methods are 3 (times), 2.8 (times) and 1.2 (times), respectively. Thus, an embodiment of the disclosure may improve the test efficiency.

From the above description, the BIST method on the multi-channel memory is disclosed in embodiments of the disclosure. In the case that a single BIST circuit is used, no matter whether the access latency time for the different channel memories are the same or not, or no matter whether the access latency for the same channel memory is fixed or varied, the test method of an embodiment of the disclosure may be used to improve the test efficiency. Thus, the test method of an embodiment of the disclosure may improve the test speed and the test quality in low test cost and reduced test time.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory control circuit, coupled to a multi-channel memory, the multi-channel memory comprises a plurality of channel memories, the memory control circuit comprising:

a plurality of channel controllers, coupled to a respective one of a plurality of channel memories of the multi-channel memory; and a built-in self-test (BIST) circuit, coupled to the channel controllers, the BIST circuit including a BIST controller and a plurality of command index registers, the BIST controller being coupled to the channel controllers, the command index registers being coupled to the BIST controller, the command index registers storing respective command indexes of the channel controllers, wherein the BIST controller receives inform from at least two of the channel controllers which indicates that the informing at least two channel controllers already complete respective current test commands;

when the BIST controller arbitrates, the BIST controller selects at least one channel controller from the informing at least two channel controllers, and based on the respective command index(es) of the selected at least one channel controller, the BIST controller sends respective next test command(s) to the selected at least one channel controller, the BIST controller determines whether the BIST controller is capable of concurrently sending the respective next test command(s) to the informing at least two channel controllers;

if the BIST controller determines that the BIST controller is capable of concurrently sending the respective next test command(s) to the informing at least two channel controllers, based on the respective command indexes of the informing at least two channel controllers, the BIST controller sends the respective next test command(s) to the informing at least two channel controllers and updates the respective command indexes of the informing at least two channel controllers; and if the BIST controller determines that the BIST controller is not capable of concurrently sending the respective next test command(s) to the informing at least two channel controllers, the BIST controller selects at least m channel controller(s) among the informing at least two channel controllers, m being a maximum type number of the test commands that the BIST controller is allowed to concurrently send, and based on the respective command indexes of the selected at least m channel controller(s), the BIST controller sends the respective next test command(s) to the selected at least m channel controller(s) and updates the respective command index(es) of the selected at least m channel controller(s).

2. The memory control circuit according to claim 1, wherein the BIST circuit further includes:
a receiving interface, coupled to the BIST controller, the receiving interface receiving a BIST command and sending to the BIST controller, the BIST controller selecting a test algorithm and generating a plurality of test commands based on the BIST command.

3. The memory control circuit according to claim 1, wherein when the BIST circuit sends the respective next test command(s) to the selected at least m channel controller(s), the BIST controller updates the respective command index(es) stored in the respective command index register(s) corresponding to the selected at least m channel controller(s).

4. The memory control circuit according to claim 1, wherein the BIST circuit further includes:
a plurality of data background generators, coupled to the BIST controller, the data background generators being for generating write data or expectation data; and
a plurality of comparators, coupled to the BIST controller and the data background generators, wherein
in executing a write test command, the data background generators generate the write data and send the write data to at least corresponding one of the channel controllers under control of the BIST controller; and
in executing a read test command, the data background generators generate the expectation data and the comparators compare read data from the channel controllers with the expectation data to decide whether a read test is passed or failed.

5. The memory control circuit according to claim 1, wherein each of the channel controllers includes:
a command buffer, coupled to the BIST controller, for buffering a test command received by the channel controller;
a read data buffer, coupled to the BIST controller, for buffering read data from the channel controller;
a write data buffer, coupled to the BIST controller, for buffering write data when a write test command is executed; and
a finite state machine (FSM), coupled to the command buffer, the read data buffer, the write data buffer and the channel memory,
in executing a read test, based on a read test command of the command buffer, the FSM buffers read data from the channel memory in the read data buffer and the FSM informs the BIST controller and returns the read data back to the BIST controller; and
in executing a write test, based on a write test command of the command buffer, the FSM informs the BIST controller and the BIST controller sends the write data to the write data buffer.

6. The memory control circuit according to claim 1, wherein the BIST controller determines that whether a type number of the respective current test commands completed by the at least two channel controllers is larger than m.

7. The memory control circuit according to claim 6, wherein when the BIST controller determines that the type number of the respective current test commands completed by the at least two channel controllers is larger than m, the BIST controller sends to the selected at least m channel controller(s) of the at least two channel controllers the respective next test command(s) whose type number matches m.

8. The memory control circuit according to claim 7, wherein a number of the selected at least m channel controller(s) is larger than or equal to m.

9. The memory control circuit according to claim 6, wherein when the BIST controller determines that the type number of the respective current test commands completed by the at least two channel controllers is not larger than m, the BIST controller sends to the at least two channel controllers the respective next test command(s) whose type number matches the type number of the respective current test commands completed by the at least two channel controllers.

10. The memory control circuit according to claim 9, wherein a number of the at least two channel controller is larger than or equal to the type number of the respective current test commands completed by the at least two channel controllers.

11. A multi-channel test method applied to a multi-channel memory coupled to a plurality of channel controllers, the multi-channel memory comprises a plurality of channel memories, the multi-channel test method comprising:
receiving inform from at least two of the channel controllers which indicates that the informing at least two channel controllers already complete respective current test commands; and
arbitrating and selecting at least one channel controller from the informing at least two channel controllers, and based on respective command index(es) of the selected at least one channel controller, sending respective next test command(s) to the selected at least one channel controller,
wherein the arbitrating step further includes:
determining whether concurrently sending the respective next test command(s) to the informing at least two channel controllers is capable or not;
if concurrently sending the respective next test command(s) to the informing at least two channel controllers is determined to be capable, based on the respective command index(es) of the informing at least two channel controllers, sending the respective next test command(s) to the informing at least two channel controllers and updating the respective command indexes of the informing at least two channel controllers; and
if concurrently sending the respective next test commands to the informing at least two channel controllers is determined to be not capable, selecting at least m channel controllers among the informing at least two channel controllers, m being a maximum type number of the test commands that the BIST controller is allowed to concurrently send, and based on the respective command indexes of the selected at least m channel controller(s), sending the respective next test command(s) to the selected at least m channel controller(s)

and updating the respective command index(es) of the selected at least m channel controller(s).

12. The multi-channel test method according to claim 11, wherein the arbitrating step further includes:
determining that whether a type number of the respective current test commands completed by the at least two channel controllers is larger than m.

13. The multi-channel test method according to claim 12, wherein the arbitrating step further includes:
when the type number of the respective current test commands completed by the at least two channel controllers is larger than m, sending to the selected at least m channel controller(s) of the at least two channel controllers the respective next test command(s) whose type number matches m.

14. The multi-channel test method according to claim 13, wherein a number of the selected at least m channel controller(s) is larger than or equal to m.

15. The multi-channel test method according to claim 12, wherein the arbitrating step further includes:
when the type number of the respective current test commands completed by the at least two channel controllers is not larger than m, sending to the at least two channel controllers the respective next test command(s) whose type number matches the type number of the respective current test commands completed by the at least two channel controllers.

16. The multi-channel test method according to claim 15, wherein a number of the at least two channel controller is larger than or equal to the type number of the respective current test commands completed by the at least two channel controllers.

* * * * *